(12) United States Patent
Jou et al.

(10) Patent No.: US 8,278,736 B2
(45) Date of Patent: Oct. 2, 2012

(54) ELECTROSTATIC DISCHARGE PROTECTION DEVICE

(75) Inventors: Yeh-Ning Jou, Taipei County (TW);
Chia-Wei Hung, Nantou County (TW);
Shu-Ling Chang, Hsinchu (TW);
Hwa-Chyi Chiou, Hsinchu (TW);
Yeh-Jen Huang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 232 days.

(21) Appl. No.: 12/875,217

(22) Filed: Sep. 3, 2010

(65) Prior Publication Data

US 2012/0056239 A1    Mar. 8, 2012

(51) Int. Cl.
*H01L 29/739* (2006.01)
*H01L 23/60* (2006.01)

(52) U.S. Cl. ........ 257/556; 257/517; 257/525; 257/557; 257/E29.197; 257/E51.004

(58) Field of Classification Search ................ 257/556, 257/517, 557, 525, 575, E51.004, 139, E29.197
See application file for complete search history.

*Primary Examiner* — Evan Pert
*Assistant Examiner* — Whitney T Moore
(74) *Attorney, Agent, or Firm* — Birch, Stewart, Kolasch & Birch, LLP

(57) ABSTRACT

An electrostatic discharge protection device coupled between a first power line and a second power line is provided. A first N-type doped region is formed in a P-type well. A first P-type doped region is formed in the first N-type doped region. A second P-type doped region includes a first portion and a second portion. The first portion of the second P-type doped region is formed in the first N-type doped region. The second portion of the second P-type doped region is formed outside of the first N-type doped region. A second N-type doped region is formed in the first portion of the second P-type doped region. The first P-type doped region, the first N-type doped region, the second P-type doped region and the second N-type doped region constitute an insulated gate bipolar transistor (IGBT).

9 Claims, 10 Drawing Sheets

ELECTROSTATIC DISCHARGE PROTECTION DEVICE

BACKGROUND OF THE INVENTION

1. Field of the Invention

The invention relates to a protection device, and more particularly to an electrostatic discharge (ESD) protection device receiving high operation voltage.

2. Description of the Related Art

As the semiconductor manufacturing process develops, ESD protection has become one of the most critical reliability issues for integrated circuits (IC). In particular, as semiconductor process advances into the deep sub-micron stage, scaled-down devices and thinner gate oxides are more vulnerable to ESD stress. Generally, a conventional method is to integrate an ESD protection device in ICs.

Different ESD protection devices have different holding voltages (Vh) and different trigger voltages (Vtl). Generally, the holding voltage (Vh) is higher than an operation voltage (VDD) to avoid latch-up problems caused by surges in voltage. During a low voltage operation, the holding voltage is typically higher than the operation voltage. Thus, standard ESD protection devices can be utilized.

However, during a high voltage operation, the holding voltage is typically less than the operation voltage (VDD). Thus, a latch-up problem may occur. To avoid the latch-up problem, a conventional method used is to increase the holding voltage. However, the trigger voltage of the ESD protection device is also increased when the holding voltage is increased. Thus, reducing the efficiency of the ESD protection device.

To increase the efficiency of the ESD protection device, another conventional method is to use a gate-grounded NMOS (GGNMOS) or a silicon controlled rectifier (SCR) as an ESD protection device. FIG. 1 is a schematic diagram of a conventional GGNMOS. FIG. 2 is a schematic diagram of a conventional N-type SCR.

Although the conventional GGNMOS or the NSCR can increase the efficiency of the ESD protection device, the holding voltage of the ESD protection device cannot be increased and the trigger voltage of the ESD protection device cannot be reduced. FIG. 3A is a schematic diagram of a conventional series GGNMOS. FIG. 3B is an equivalent circuit of the conventional series GGNMOS shown in FIG. 3A. Since the GGNMOSs are connected in series, the holding voltage of the ESD protection device can be increased.

However, the trigger voltage of the ESD protection device is also increased when the holding voltage is increased. Thus, a resistor R and a capacitor C are utilized to reduce the trigger voltage of the ESD protection device. Although the structure of the ESD protection device shown in FIG. 3A, allows the holding voltage of the ESD protection device to be increased and the trigger voltage of the ESD protection device to be reduced, a leakage current problem occurs.

FIG. 3C is a characteristic diagram of the series GGNMOS shown in FIG. 3A. The curve 31 represents a relationship between the voltage and the current of the series GGNMOS shown in FIG. 3A. The curve 32 represents a relationship between the voltage and the leakage current of the series GGNMOS shown in FIG. 3A.

As shown in the curve 32, leakage current of a series GGNMOS is suddenly increased when snapback breakdown occurs.

BRIEF SUMMARY OF THE INVENTION

In accordance with an embodiment, an electrostatic discharge protection device is coupled between a first power line and a second power line and comprises a P-type well, a first N-type doped region, a first P-type doped region, a second P-type doped region and a second N-type doped region. The first N-type doped region is formed in the P-type well. The first P-type doped region is formed in the first N-type doped region. The second P-type doped region comprises a first portion and a second portion. The first portion of the second P-type doped region is formed in the first N-type doped region. The second portion of the second P-type doped region is formed outside of the first N-type doped region. The second N-type doped region is formed in the first portion of the second P-type doped region. The first P-type doped region, the first N-type doped region, the second P-type doped region and the second N-type doped region constitute an insulated gate bipolar transistor (IGBT).

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
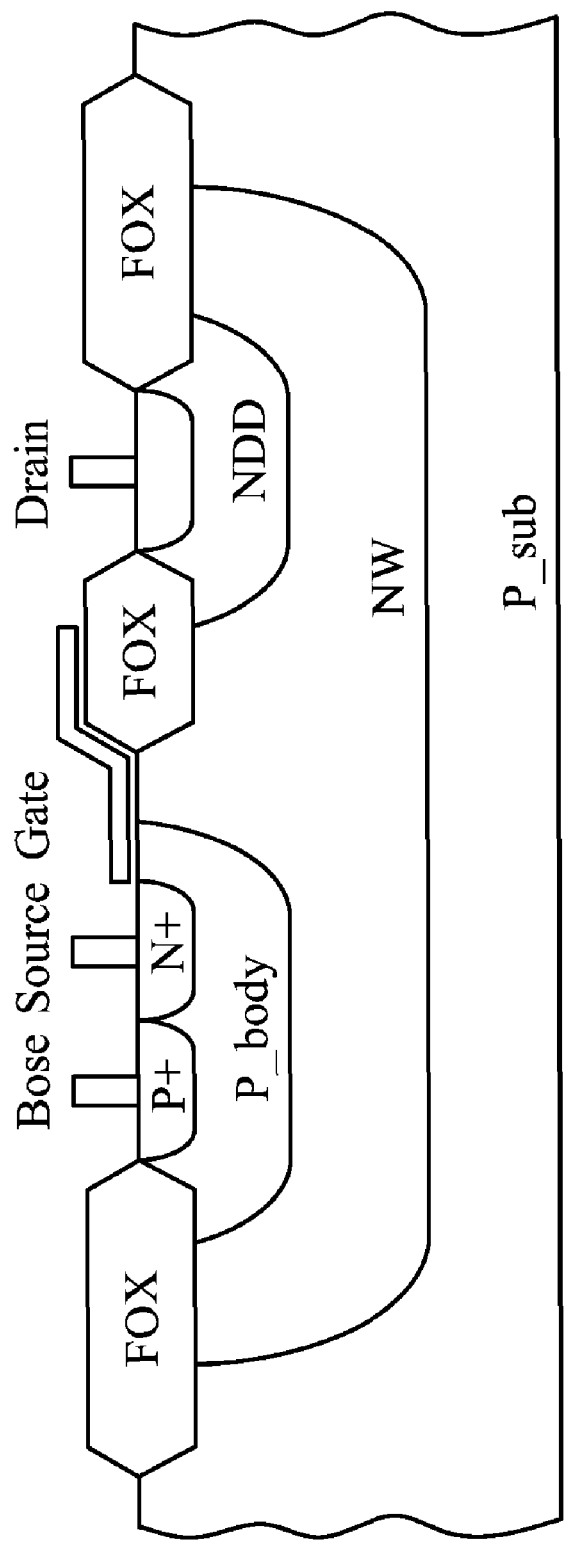
FIG. 1 is a schematic diagram of a conventional GGNMOS.
Figure 2:
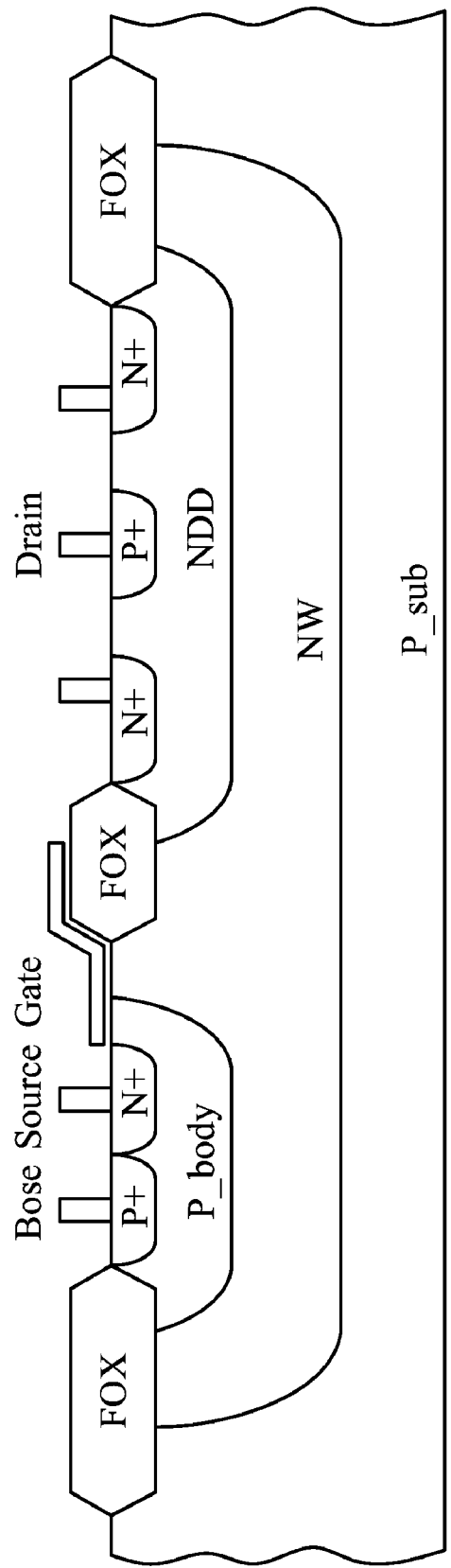
FIG. 2 is a schematic diagram of a conventional N-type SCR.
Figure 3A:
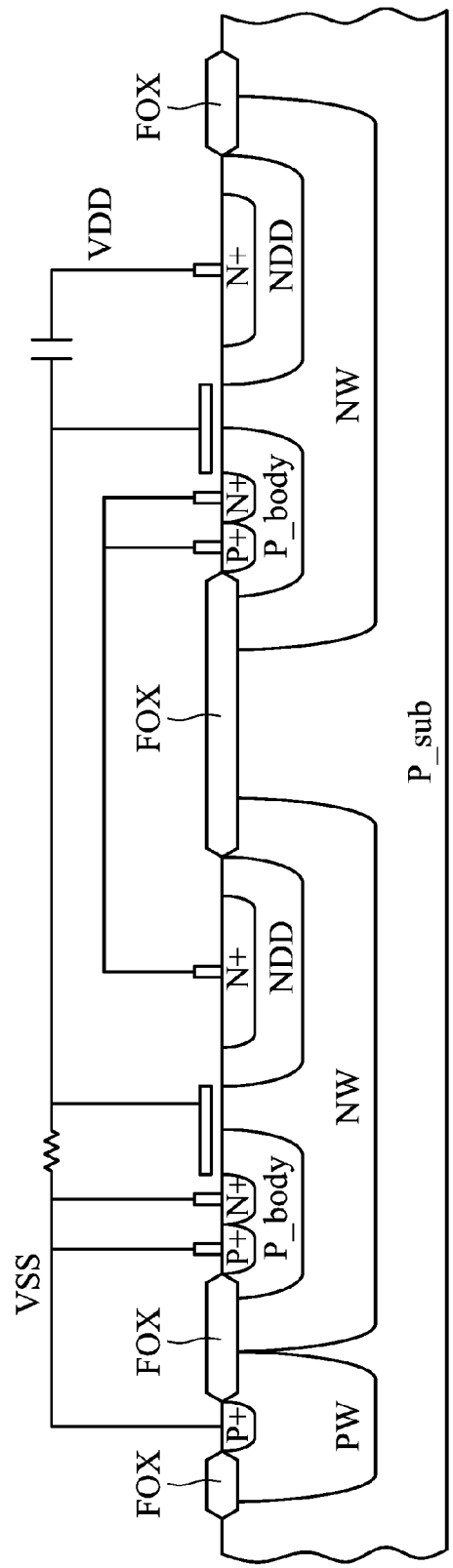
FIG. 3A is a schematic diagram of a conventional series GGNMOS.
Figure 3B:
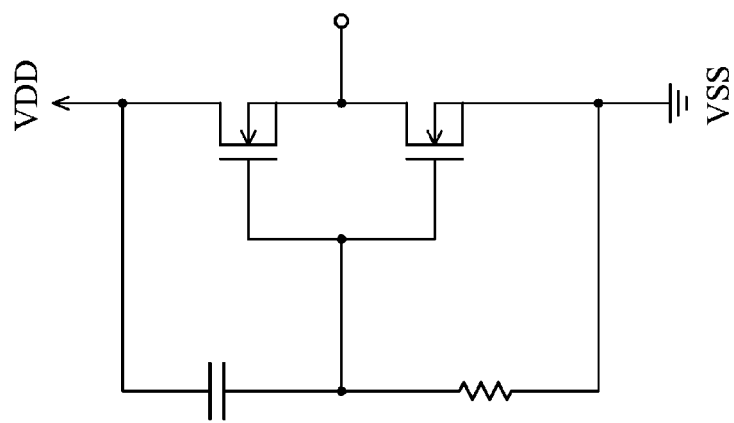
FIG. 3B is an equivalent circuit of the conventional series GGNMOS shown in FIG. 3A.
Figure 3C:
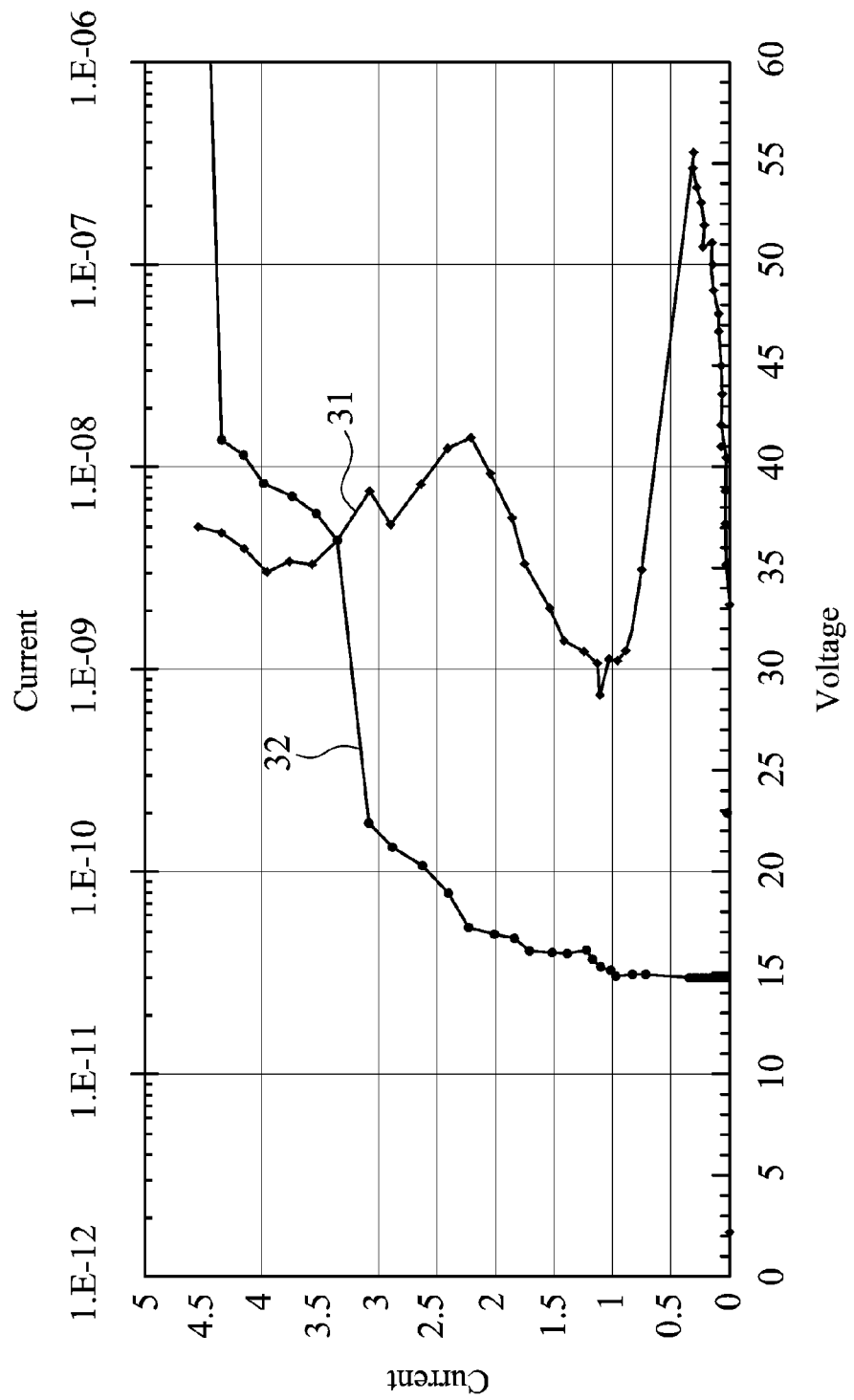
FIG. 3C is a characteristic diagram of the series GGNMOS shown in FIG. 3A.
Figure 4A:
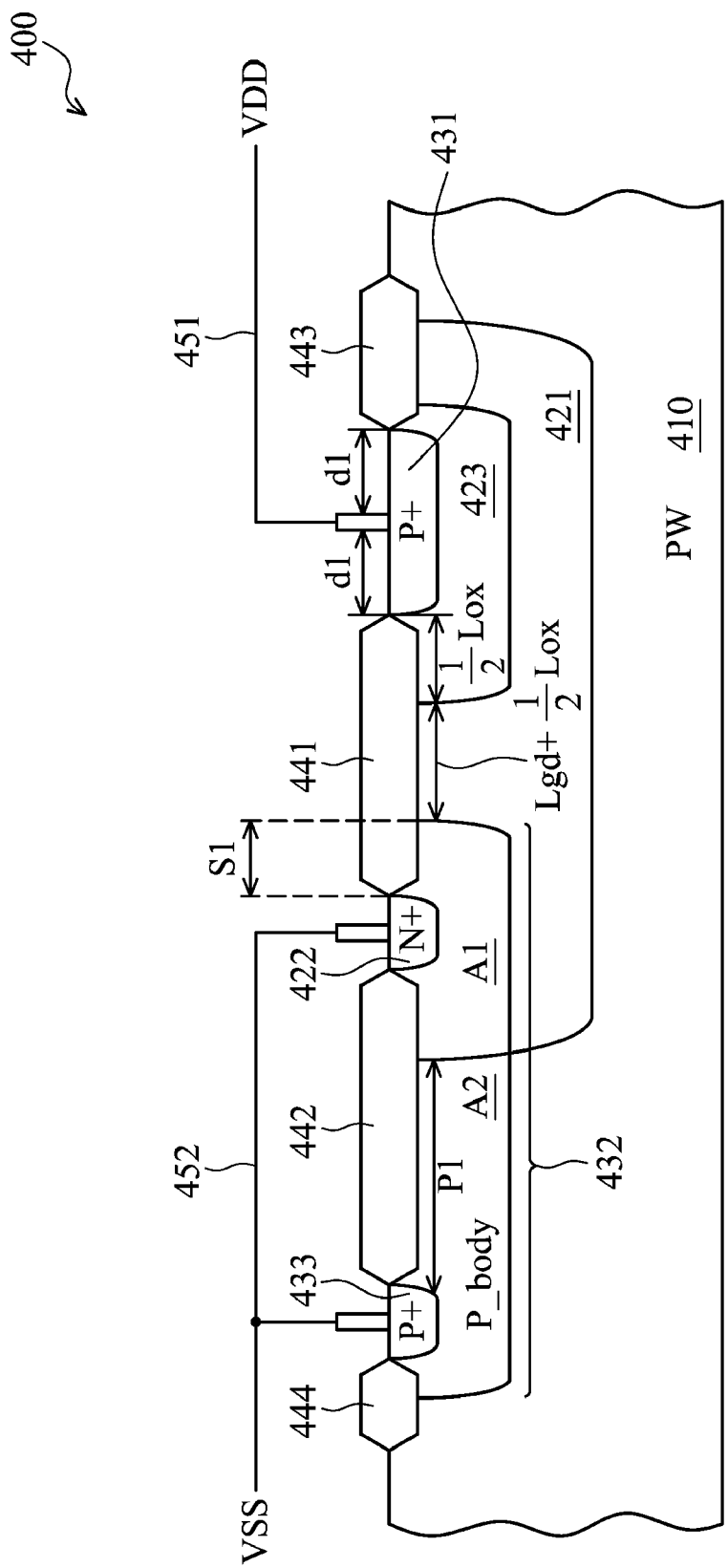
FIG. 4A is a schematic diagram of an exemplary embodiment of an ESD protection device.

FIG. 4A is a schematic diagram of an exemplary embodiment of an ESD protection device. The ESD protection device 400 is an insulated gate bipolar transistor (IGBT). The IGBT is formed by a P-type doped region 431, an N-type doped region 421, a P-type doped region 432 and an N-type doped region 422.

When an ESD event occurs in the power line 451 and the power line 452 receives a ground level, an ESD current flows from the P-type doped region 431, the N-type doped region 421, the P-type doped region 432 and the N-type doped region 422 to the power line 452.

As shown in FIG. 4A, the N-type doped region 421 is formed in the P-type well 410. In this embodiment, the N-type doped region 421 is a well and is capable of sustaining high operation voltage. Thus, the N-type doped region 421 can be referred to as a high voltage N-type well (HVNW).

The P-type doped region 431 is formed in the N-type doped region 421. In this embodiment, the P-type doped region 431 is a heavily doped region and coupled to the power line 451. Generally, the symbol P+ represents a heavily doped P-type region. As shown in FIG. 4A, the left edge of the P-type doped region 431 contacts with a field oxide 441 and the right edge of the P-type doped region 431 contacts with a field oxide 443.

The P-type doped region 432 comprises a first portion A1 and a second portion A2. The first portion A1 of the P-type doped region 432 is formed in the N-type doped region 421. The second portion A2 of the P-type doped region 432 is formed outside of the N-type doped region 421. In this embodiment, the P-type doped region 432 is also referred to as a P-body. The doped concentration of the P-type doped region 432 is less than the doped concentration of the P-type doped region 431.

The N-type doped region 422 is formed in the first portion A1 of the P-type doped region 432. In this embodiment, the N-type doped region 422 is a heavily doped region. The doped concentration of the N-type doped region 422 is less than the doped concentration of the N-type doped region 421. Generally, the symbol N+ represents a heavily N-type doped region.

In this embodiment, the ESD protection device 400 further comprises an N-type doped region 423 and a P-type doped region 433, but the disclosure is not limited thereto. Since the doped concentration of the P-type doped region 431 is higher than the doped concentration of the N-type doped region 421, the N-type doped region 423 is disposed between the P-type doped region 431 and the N-type doped region 421.

In this embodiment, the N-type doped region 423 is an N-type drain drift (NDD). The doped concentration of the N-type doped region 423 is higher than the doped concentration of the N-type doped region 421. In other embodiments, a P-type doped region, such as a P-type drain drift (PDD), is utilized to replace the N-type doped region 423.

The P-type doped region 433 is also a heavily doped region. In this embodiment, the P-type doped region 433 serves as an electro-contact point of the P-type doped region 432. A field oxide 442 is disposed between the P-type doped region 433 and the N-type doped region 422. The N-type doped region 422 and the P-type doped region 433 are formed in the P-type doped region 432. The P-type doped region 433 is disposed between a field oxide 444 and the field oxide 442.

In addition, the P-type doped region 431 is coupled to the power line 451 and the P-type doped region 433 and the N-type doped region 422 are coupled to the power line 452. During normal operation (no ESD event), the power line 451 receives a high operation voltage VDD and the power line 452 receives a low operation voltage VSS. In one embodiment, the high operation voltage VDD may be 24V and the low operation voltage VSS may be 0V, but the disclosure is not limited thereto.

In this embodiment, the distances S1, d1, Lgd, Lox, and P1 are adjusted to increase the holding voltage (Vh) of the ESD protection device 400 and reduce the trigger voltage (Vtl) of the ESD protection device 400. In this embodiment, the right edge of the field oxide 441 contacts with the left side of the P-type doped region 431 and the left edge of the field oxide 443 contacts with the right side of the P-type doped region 431. Thus, a leakage current is approximately 1E-11A. The distances S1 and d1 are controlled so that the leakage current is reduced, wherein the reduce level is approximately 1-1.5 stages (7E-13A). The invention does not limit the distances S1 and d1. In one embodiment, the distance S1 is within 0.35 um-100 um and the distance d1 is within 1 um-30 um.

Figure 4B:
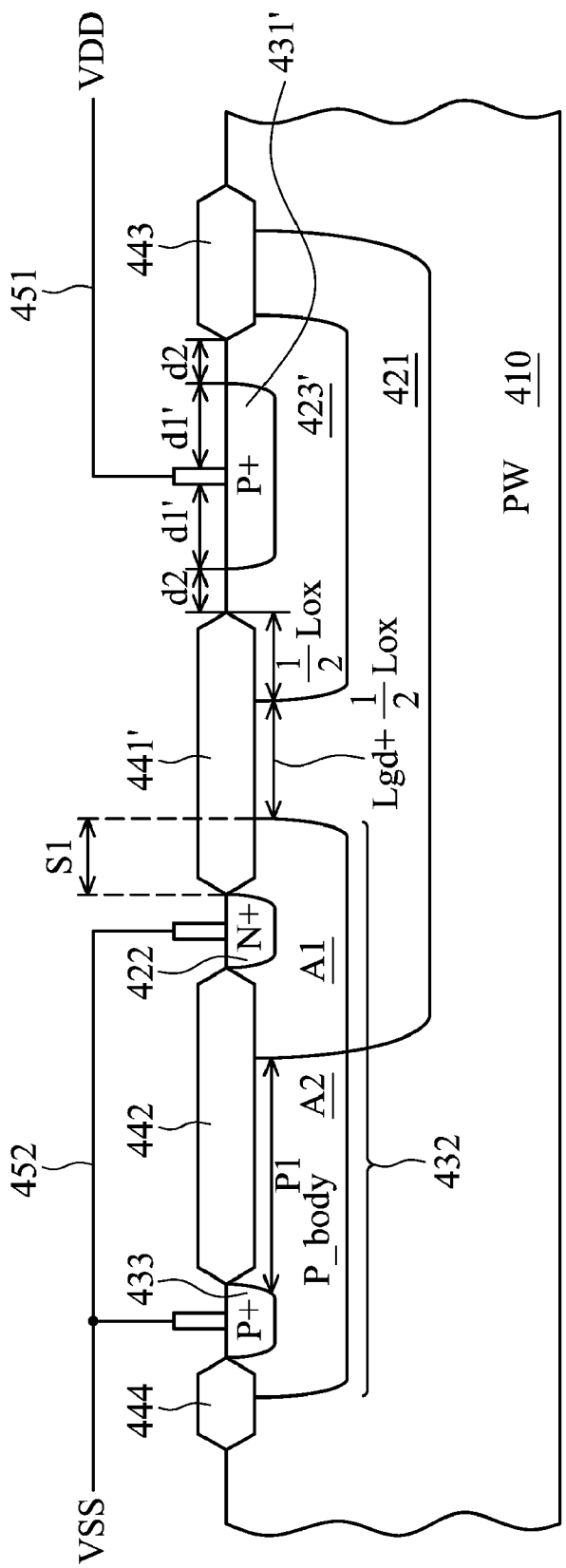
FIG. 4B is a schematic diagram of another exemplary embodiment of an ESD protection device.

FIG. 4B is a schematic diagram of another exemplary embodiment of an ESD protection device. FIG. 4B is similar to FIG. 4A with the exception that the right edge of the field oxide 441' does not contact with the left side of the P-type doped region 431' and the left edge of the field oxide 443 does not contact with the right side of the P-type doped region 431'. In this embodiment, a portion of the N-type doped region 423' separates the field oxide 441' from the P-type doped region 431' and another portion of the N-type doped region 423' separates the field oxide 443 from the P-type doped region 431'.

Since the edges of the field oxides 441' and 443 do not contact with the edges of the P-type doped region 431', a space d2 occurs between the field oxide 441' and the P-type doped region 431' and another space d2 occurs between the field oxide 443 and the P-type doped region 431'. The space d2 and the distance d1' can be adjusted so that the leakage current is reduced, wherein the reduce level is approximately 1-1.5 stages (7E-13A). In addition, since the field oxides 442~444 of FIG. 4B are similar to the field oxides 442~444 of FIG. 4A, the descriptions of the field oxides 442~444 of FIG. 4B are omitted for brevity.

Figure 5A:
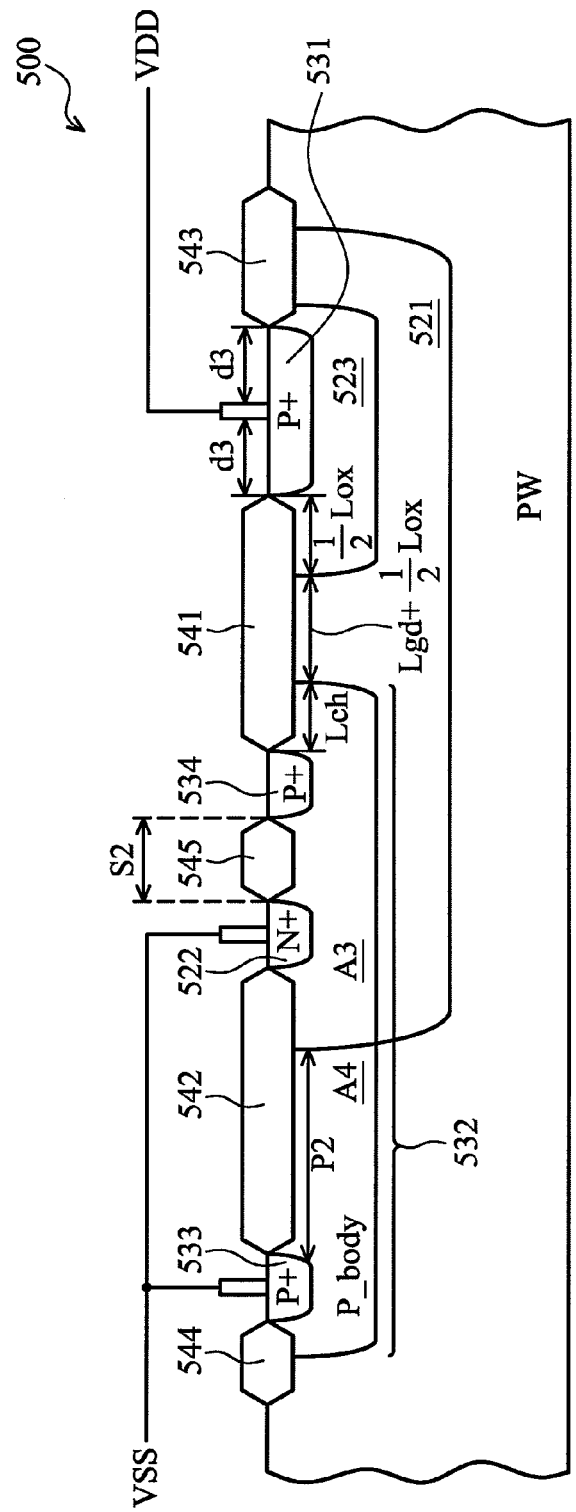
FIG. 5A is a schematic diagram of another exemplary embodiment of an ESD protection device.

FIG. 5A is a schematic diagram of another exemplary embodiment of an ESD protection device. FIG. 5A is similar to FIG. 4A except for the addition of a field oxide 545 and a P-type doped region 534. Since the field oxides 542~544 of FIG. 5A are similar to the field oxides 442~444 of FIG. 4A, the descriptions of the field oxides 542~544 are omitted for brevity.

The field oxide 545 is formed between the N-type doped region 522 and the P-type doped region 534. The distance between the edges of the field oxide 545 is S2. The distance S2 is adjusted to hinder a leakage current problem.

In this embodiment, the P-type doped region 532 comprises a first portion A3 and a second portion A4. The first portion A3 of the P-type doped region 532 is formed in the N-type doped region 521. The second portion A4 of the P-type doped region 532 is formed outside of the N-type doped region 521.

Additionally, the P-type doped region 534, the N-type doped region 522 and the P-type doped region 533 are formed in the P-type doped region 532. The distances Lch, Lgd and Lox are adjusted to hinder a leakage current problem. Since the distances S2, P2, d3, Lch, Lgd and Lox are clearly shown in FIG. 5A, the defining methods of the distances S2, P2, d3, Lch, Lgd and Lox are omitted.

Figure 5B:
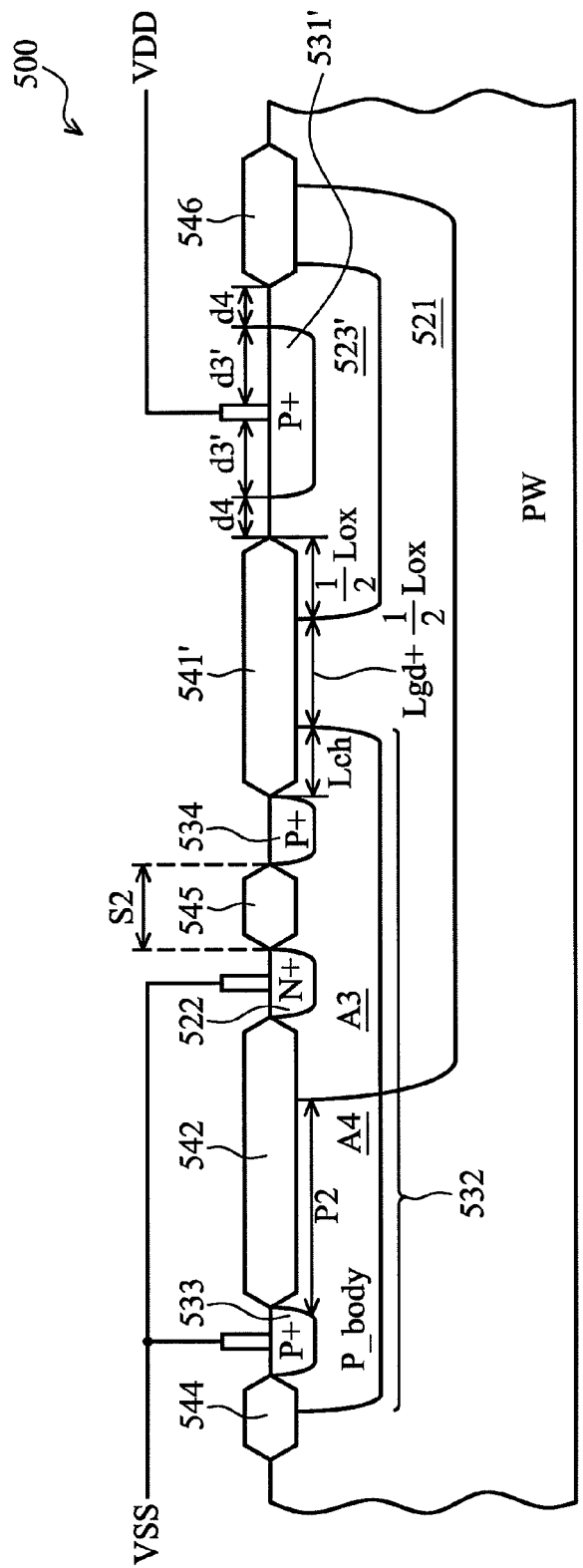
FIG. 5B is a schematic diagram of another exemplary embodiment of an ESD protection device.

FIG. 5B is a schematic diagram of another exemplary embodiment of an ESD protection device. FIG. 5B is similar to FIG. 5A with the exception that the right edge of the field oxide 541' does not contact with the left side of the P-type doped region 531' and the left edge of the field oxide 546 does not contact with the right side of the P-type doped region 531'.

Since the edges of the field oxides 541' and 546 do not contact with the edges of the P-type doped region 531', a space d4 occurs between the field oxide 541' and the P-type doped region 531' and another space d4 occurs between the field oxide 546 and the P-type doped region 531'. The space d4 and the distance d3' can be adjusted to reduce the leakage current of the ESD protection device 500. In addition, since the field oxides 542 and 544 of FIG. 5B are similar to the field oxides 542 and 544 of FIG. 5A, the descriptions of the field oxides 542 and 544 are omitted for brevity.

Figure 6:
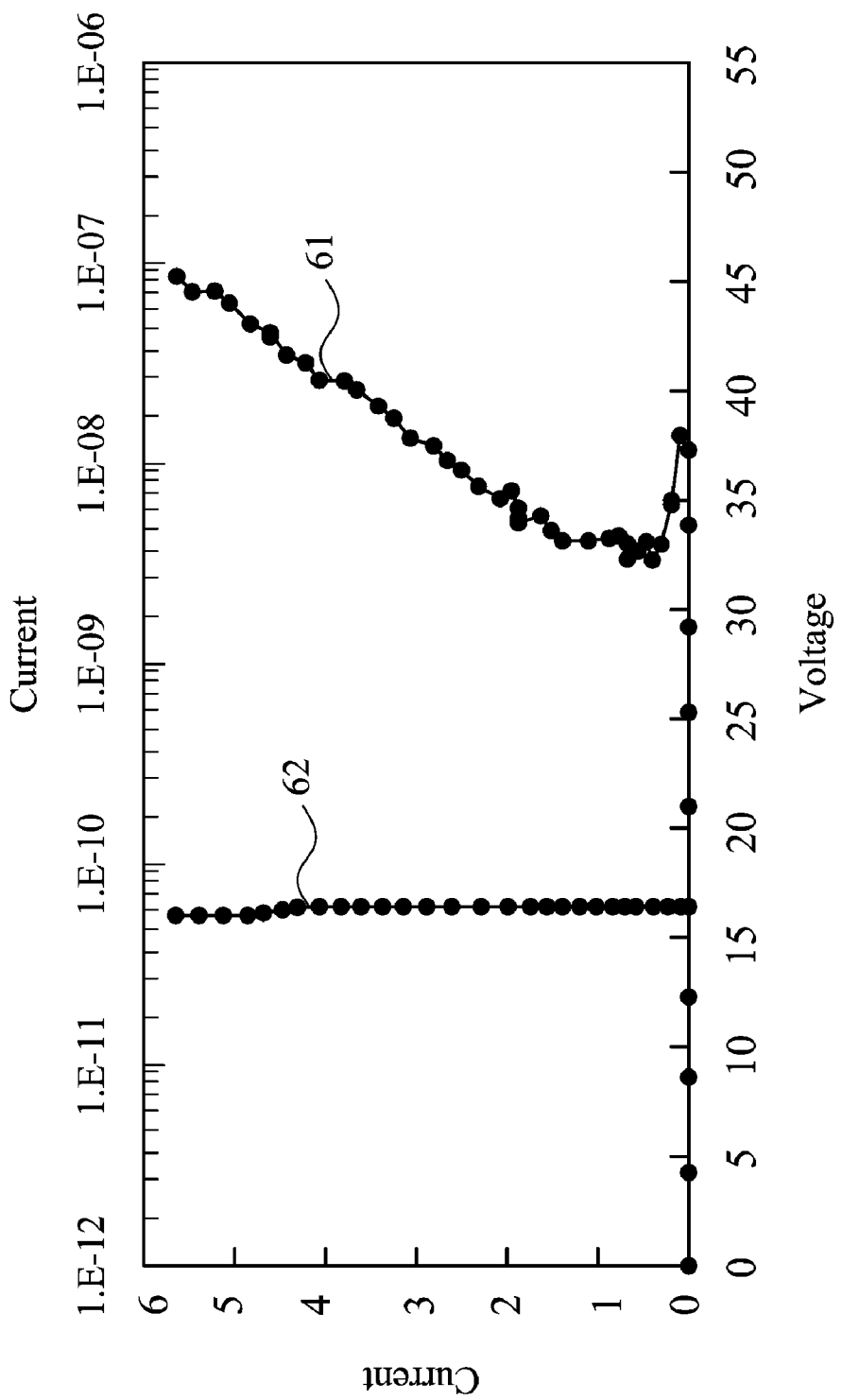
FIG. 6 is a characteristic diagram of the ESD protection device of the invention.

FIG. 6 is a characteristic diagram of the ESD protection device of the invention. The curve 61 represents a relationship between the voltage and the current of an ESD protection device. The curve 62 represents a relationship between the voltage and the leakage current of the ESD protection device. Taking FIG. 5A as an example, assuming the distance S2 is 15 um, the distance Lch is 0.75 um, the distance Lgd is 40 um, the distance Lox is 2 um, the distance d3 is 10 um and the distance P2 is 15 um.

As shown in the curve 61, the holding voltage of the ESD protection device 500 is approximately 33V higher than the high operation voltage VDD (24V). Further, the trigger voltage of the ESD protection device 500 is approximately 38V. As shown in the curve 62, the leakage current of the ESD protection device 500 is maintained at a fix value.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device coupled between a first power line and a second power line, comprising:
   a P-type well;
   a first N-type doped region formed in the P-type well;
   a first P-type doped region formed in the first N-type doped region;
   a second P-type doped region, wherein a first portion of the second P-type doped region is formed in the first N-type doped region and a second portion of the second P-type doped region is formed outside of the first N-type doped region; and
   a second N-type doped region formed in the first portion of the second P-type doped region, wherein the first P-type doped region, the first N-type doped region, the second P-type doped region and the second N-type doped region constitute an insulated gate bipolar transistor (IGBT).

2. The electrostatic discharge protection device as claimed in claim 1, further comprising:
   a first field oxide formed between the second N-type doped region and the first P-type doped region.

3. The electrostatic discharge protection device as claimed in claim 2, wherein the first field oxide contacts with an edge of the first P-type doped region.

4. The electrostatic discharge protection device as claimed in claim 2, further comprising:
   a third N-type doped region formed in the first N-type doped region, wherein a portion of the third N-type doped region separates the first field oxide from the first P-type doped region formed in the third N-type doped region.

5. The electrostatic discharge protection device as claimed in claim 1, further comprising:
   a third P-type doped region formed in the first portion of the second P-type doped region;
   a first field oxide formed between the first and the third P-type doped regions; and
   a second field oxide formed between the third P-type doped region and the second N-type doped region.

6. The electrostatic discharge protection device as claimed in claim 5, wherein first field oxide contacts with an edge of the first P-type doped region.

7. The electrostatic discharge protection device as claimed in claim 5, further comprising:
   a third N-type doped region formed in the first N-type doped region, wherein a portion of the third N-type doped region separates the first field oxide from the first P-type doped region formed in the third N-type doped region.

8. The electrostatic discharge protection device as claimed in claim 5, further comprising:
   a fourth P-type doped region formed in the second portion of the second P-type doped region; and
   a third field oxide formed between the fourth P-type doped region and the second N-type doped region.

9. The electrostatic discharge protection device as claimed in claim 8, wherein the first P-type doped region is coupled to the first power line and the second N-type doped region and the fourth P-type doped region are coupled to the second power line.

* * * * *